United States Patent
Pfeiffer et al.

(10) Patent No.: US 7,428,671 B2
(45) Date of Patent: Sep. 23, 2008

(54) MEMORY MODULE WITH TEST STRUCTURE

(75) Inventors: Johann Pfeiffer, Ottobrunn (DE); Helmut Fischer, Oberhaching (DE)

(73) Assignee: Qimonda AG, Munich (DE)

(*) Notice: Subject to any disclaimer, the term of this patent is extended or adjusted under 35 U.S.C. 154(b) by 604 days.

(21) Appl. No.: 10/452,482

(22) Filed: Jun. 2, 2003

(65) Prior Publication Data
US 2004/0153922 A1    Aug. 5, 2004

(30) Foreign Application Priority Data
May 31, 2002    (DE)    ................. 102 24 255

(51) Int. Cl.
*G11C 29/00*    (2006.01)
*G11C 7/00*    (2006.01)

(52) U.S. Cl. ...................... 714/718; 365/201
(58) Field of Classification Search ................ 714/719, 714/724, 718; 365/201
See application file for complete search history.

(56) References Cited

U.S. PATENT DOCUMENTS

| | | | |
|---|---|---|---|
| 4,481,627 A * | 11/1984 | Beauchesne et al. ........ | 714/718 |
| 4,860,290 A * | 8/1989 | Daniels et al. .............. | 714/726 |
| 5,054,024 A * | 10/1991 | Whetsel ..................... | 714/726 |
| 5,173,904 A * | 12/1992 | Daniels et al. .............. | 714/729 |
| 5,617,531 A * | 4/1997 | Crouch et al. ............... | 714/30 |
| 5,712,822 A * | 1/1998 | Petrosino .................... | 365/201 |
| 5,781,559 A * | 7/1998 | Muris et al. ................. | 714/726 |
| 5,995,731 A * | 11/1999 | Crouch et al. ............... | 716/4 |
| 6,321,320 B1 | 11/2001 | Fleischman et al. | |
| 6,327,681 B1 * | 12/2001 | Yamagishi et al. .......... | 714/718 |
| 6,560,740 B1 * | 5/2003 | Zuraski, Jr. et al. ......... | 714/733 |
| 6,681,359 B1 * | 1/2004 | Au et al. ..................... | 714/733 |
| 6,728,910 B1 * | 4/2004 | Huang ......................... | 714/711 |
| 6,763,490 B1 * | 7/2004 | Krech, Jr. et al. ........... | 714/738 |
| 6,769,081 B1 * | 7/2004 | Parulkar ...................... | 714/733 |

OTHER PUBLICATIONS

"Design-for-Test Analysis of a Buffered SDRAM DIMM" by Jandhyala et al. This paper appears in: Records of the 1996 IEEE Memory Technology, International Workshop on Design and Testing, Publication.Date: 1996 On page(s): 110-116 ISSN: 1087-4852 ISBN: 0-8186-7466-0.*

* cited by examiner

*Primary Examiner*—Cynthia Britt
(74) *Attorney, Agent, or Firm*—Laurence A. Greenberg; Werner H. Stemer; Ralph E. Locher

(57) ABSTRACT

A memory module has a memory cell configuration. For the purpose of testing the memory cell configuration, the memory module has a test structure with at least two test circuits, which are disposed in a distributed fashion on the memory module and are connected to one another via a common test switching bus, which can be connected to an address bus of the memory module via a decoupling circuit during a test operation.

6 Claims, 2 Drawing Sheets

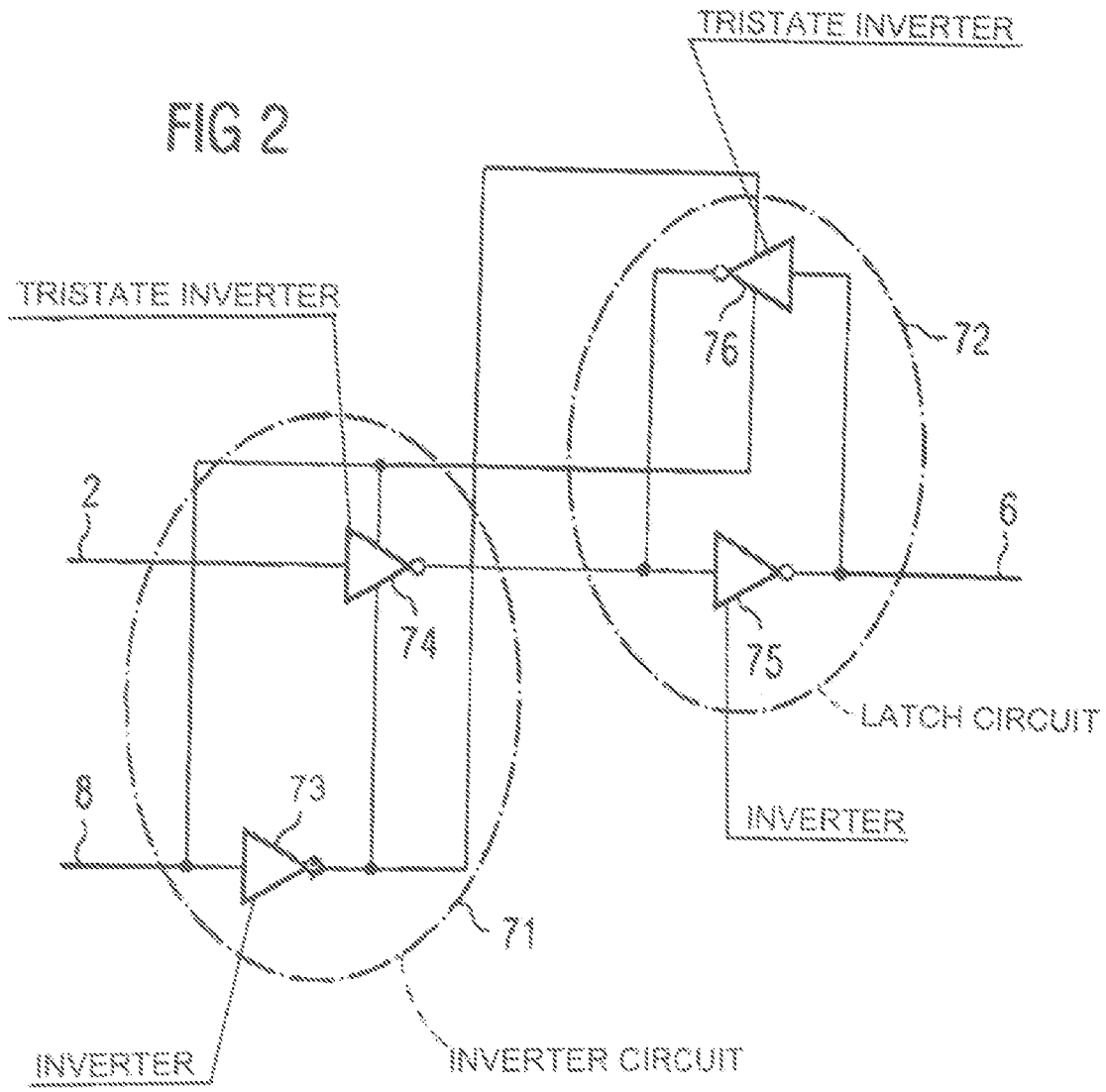

MEMORY MODULE WITH TEST STRUCTURE

BACKGROUND OF THE INVENTION

Field of the Invention

The invention relates to a memory module having a memory cell configuration and a test structure, which is connected to the memory cell configuration via test lines in order to test the memory cells.

What is primarily tested during the functional test of memory modules is whether it is possible, without any errors, to write to and read from the memory cells intrinsically by themselves and in as many conceivable combinations as possible with memory contents and different preconditions. To that end, specific test bit patterns are written in each case to the individual memory cells or the complete memory and are then read out again, the read-out test bit patterns being compared with the written-in test bit patterns. In addition to the bit patterns, often the addressing order, the temporal succession of the control signals, the reading time and the operating voltage or the ambient temperature are also varied in a suitable manner in order thus to be able to detect both static faults, e.g. defective memory cells and addressing errors, and dynamic faults, e.g. crosstalk.

In order to shorten the time required for such functional tests, in many cases use is made of so-called on-chip test systems, in which the test structure for the functional test is provided together with the memory cell configuration on the same chip. In this case, the test structure is usually configured as a central block with the required test circuits, the test circuit block being connected to the individual control and monitoring circuits of the memory module via corresponding test lines. The requirements made of the test structure are becoming evermore stringent on account of the continually increasing storage capacity and memory speed. These increased test requirements in turn lead to a rising number of test circuits in the test circuit block, resulting in an additional chip area requirement for the circuit layout or the wiring with the monitoring and control circuits. This additional area requirement results in that the wiring of the test circuit block is more and more becoming one of the limiting factors for the progressive miniaturization of the chip area.

U.S. Pat. No. 6,321,210 B1 discloses a test structure disposed in a distributed fashion on a memory module, provision being made of two test blocks that are connected to one another via a test circuit bus.

SUMMARY OF THE INVENTION

It is accordingly an object of the invention to provide a memory module with a test structure that overcomes the above-mentioned disadvantages of the prior art devices of this general type, which enables a higher packing density on a chip area.

With the foregoing and other objects in view there is provided, in accordance with the invention, a memory module. The memory module contains test lines, a test circuit bus, a memory cell configuration connected to the test lines, and a test structure connected to the memory cell configuration through the test lines for testing the memory cell configuration. The test structure has at least two test circuits disposed in a distributed fashion and are connected to one another via the test circuit bus. An address bus is connected to the test circuit bus.

According to the invention, the test structure is disposed in a distributed fashion on the memory module in at least two blocks, the individual test circuit blocks being connected to one another via a test circuit bus. What is made possible by the embodiment is that the on-chip test structure does not have to be embodied as a central unit with a high space requirement on the chip, but rather is divided into a plurality of blocks and can be positioned at different free locations on the chip in a manner as neutral as possible in respect of area, the individual test circuit blocks being supplied with the required information via the test circuit bus. Through skilful distribution of the individual test circuit blocks, it is thus possible to reduce the area required for the test structure and hence to reduce the chip size.

Furthermore, the test circuit bus is connected to an address bus of the memory module. This leads to a further saving in chip area, since the dictates of construction methods that each memory module already has to be provided with such an address bus, so that it is only necessary to provide additional bus sections for connecting the address bus to the individual test circuit blocks and, consequently, it is not necessary to integrate an additional bus on the memory module.

Furthermore, an additional circuit is provided between the test circuit bus and the address bus and interconnects the test circuit bus with the address bus only when one of the test circuits connected to the test circuit bus is intended to be activated. This ensures that the address bus interacts with the test circuit bus, and the test circuits are thus acted on, only when a functional test is intended to be performed. This configuration prevents a situation in which the address bus is loaded capacitively, in particular by the test circuits during its normal operation and the bus performance can thus be impaired. Therefore, the configuration of the test structure in which the test circuit bus is connected in only in the event of an activation of one of the test circuits has the advantage that current is required only when a functional test is intended to be carried out.

In accordance with a preferred embodiment, the additional circuit between the address bus and the test circuit bus is provided with a latch circuit, which holds the test circuit bus at a defined level. This enables the test circuit bus additionally to be used as a shielding line for sensitive control lines, e.g. for the clock line.

In accordance with an added feature of the invention, a decoupling circuit is connected between the test circuit bus and the address bus for interconnecting the test circuit bus with the address bus in an event of an activation of a test operation. The decoupling circuit has an inverter circuit connected to the address bus and a latch circuit connected to the test circuit bus.

In accordance with a further feature of the invention, a common test mode line is provided and at least two of the test circuit bus sections each connect at least one of the test circuits to the address bus. A decoupling switching configuration has at least two decoupling circuits each connected between one of the test circuit bus sections and the address bus. The decoupling circuits are connected to and are driven by the common test mode line for connecting the test circuit bus sections to the address bus if the functional test is intended to be carried out.

In accordance to an additional feature of the invention, the decoupling switching configuration has an inverter circuit connected to the address bus, and a latch circuit connected to the test circuit bus.

Other features which are considered as characteristic for the invention are set forth in the appended claims.

Although the invention is illustrated and described herein as embodied in a memory module with a test structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of a circuit for linking a test circuit bus line to an address bus line.

DESCRIPTION OF THE PREFERRED EMBODIMENTS

Figure 1:
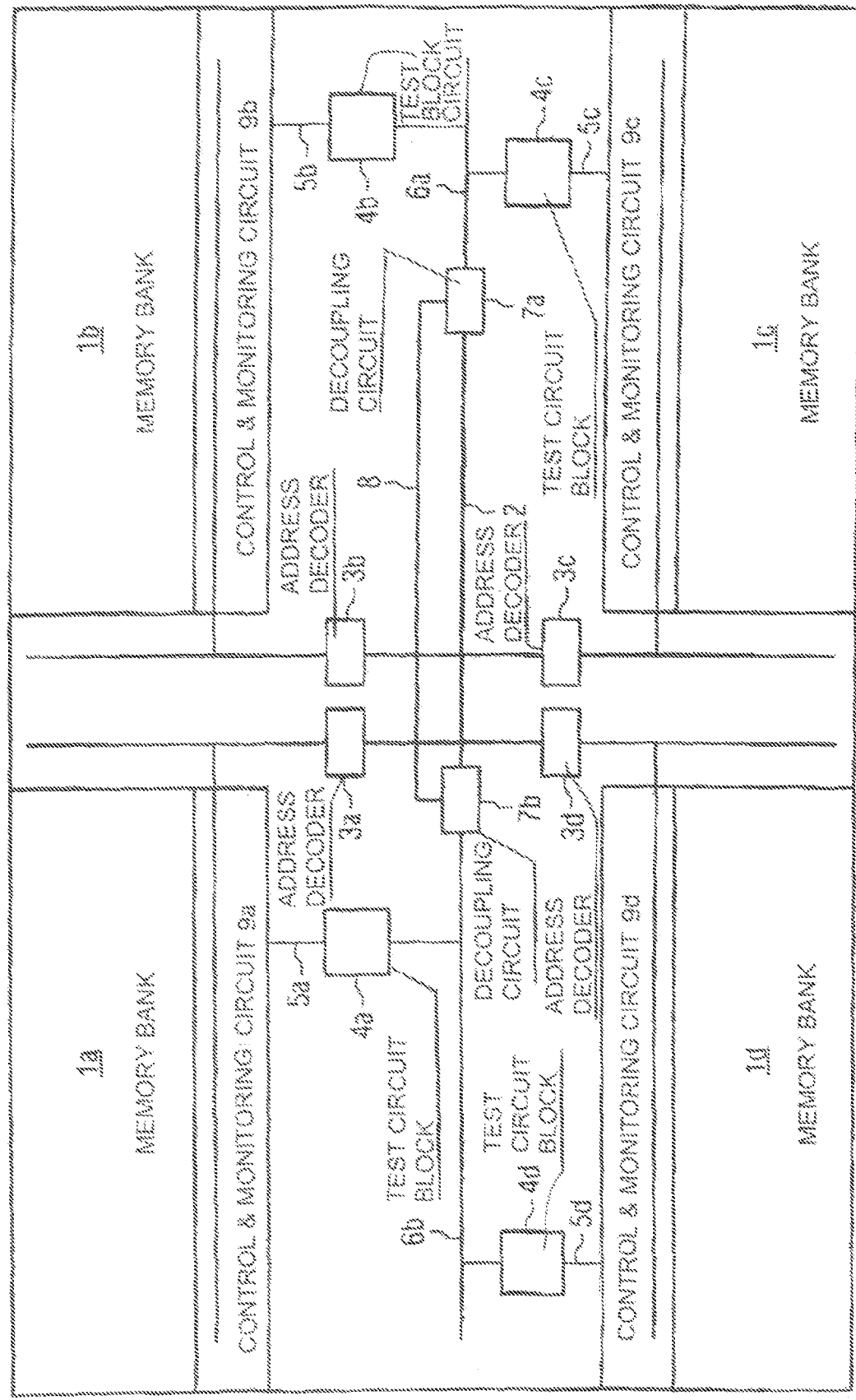
FIG. 1 is a block diagram of a DRAM memory module with a distributed test structure according to the invention.

Referring now to the figures of the drawing in detail and first, particularly, to FIG. 1 thereof, there is shown a memory module configuration according to the invention which will be explained using the example of a dynamic random access memory (DRAM), of which only components that are essential to the invention are illustrated in FIG. 1. However, the configuration of the memory module with a test structure can also be used for other known semiconductor memory concepts, e.g. static random access memories.

FIG. 1 shows a DRAM memory having four memory banks 1a to 1d, which are disposed in a distributed fashion on the semiconductor chip and each contain a square matrix of memory cells. Data can be stored in the memory cells and be read out again, a specific memory cell being selected by the application of a corresponding address to a common address bus 2 of the memory module. An applied address is then decoded by the decoding circuits 3a to 3d connected to the respective memory banks 1 in order to determine the desired cell for a write-in or read-out operation.

In order to be able to perform a functional test of the DRAM memory shown in FIG. 1, there is a test structure disposed on the DRAM chip, which test structure is composed of four test circuit blocks 4a to 4d in the example illustrated. The test circuit blocks 4 may in each case be disposed in a space-saving manner on structurally resulting free areas on the chip. This makes it possible to reduce the chip area required for the test structure to a minimum. Instead of being subdivided in four blocks as shown, the test structure may also be subdivided further, as required. In the exemplary embodiment shown, each test circuit block 4 is assigned to a memory bank 1 in order to test the memory bank. For this purpose, the memory bank 1 is connected to the respective test circuit block 4 via test lines 5a to 5d, via which the data necessary for the test can be written to the control and monitoring circuits 9a-9d in order then to ascertain, by a comparison of a written value and a value read out again, whether the respective memory bank contains defective memory areas.

Since the memory banks 1a to 1d of the DRAM memory have an identical type of construction and are present with an identical size in the exemplary embodiment illustrated, identical data can be written to all the memory banks during a predetermined test run. In order to be able to control the test sequence with the individual test circuit blocks 4, e.g. to carry out a parallel test of all the memory banks, the individual test blocks 4 are connected to one another via a test circuit bus 6. The respectively desired test circuit block or a test circuit contained therein is then activated via the test circuit bus 6 in order to carry out the desired test sequence.

In order to be able to embody the test circuit bus 6 in a space-saving manner, and, in particular in the DRAM, not to have to provide a complete new additional bus, the test circuit bus 6 is configured as part of an address bus 2, the test circuit bus adjoining an end of the address bus 2 with a respective test circuit bus section 6a, 6b. In order to avoid unnecessary loading of the address bus 2 in normal operation by the test circuits connected to the address bus via the test circuit bus 6, a decoupling circuit 7a, 7b is in each case provided between the respective test circuit bus section 6a, 6b and the address bus 2. The decoupling circuits 7a, 7b are driven via a common test mode line 8 in such a way that the decoupling circuits 7a, 7b connect the address bus 2 to the test circuit bus sections 6a, 6b and thus load the address bus with the test circuits only when a functional test is intended to be carried out. In normal operation, the decoupling circuits 7a, 7b effect blocking and so prevent the address bus 2 from being capacitively loaded with the test circuits and thus being impaired in its performance.

FIG. 2 illustrates a possible configuration of a decoupling circuit 7. The decoupling circuit 7 is essentially composed of an inverter circuit 71 and a latch circuit 72. The inverter circuit 71 has a first inverter 73, at whose input a signal on the test mode line 8 is present. The first inverter 73 amplifies the input signal and simultaneously forms a phase shift through 180°. The output signal of the first inverter 73 is applied to a first control input of a first tristate inverter 74, at whose second control input the signal on the test mode line 8 is present. The input of the first tristate inverter 74 is furthermore connected to the address bus line 2.

The output signal of the first tristate inverter 74 is in turn present at the input of the latch circuit 72. The latch circuit 72 is composed of a second inverter 75 and a second tristate inverter 76 connected in parallel, the input of the second inverter 75 being connected to the output of the tristate inverter 76 and the output of the second inverter 75 being connected to the input of the tristate inverter 76. The output of the inverter 75 is furthermore connected to the test circuit bus line 6. The signal on the test mode line 8 is present on a first control line of the tristate inverter 76 and the output signal of the first inverter 73 of the inverter circuit 71 is present on a second control line.

The decoupling circuit 7 constructed in this way has the effect that when a low level is present on the test mode line 8, i.e. a functional test is not intended to be carried out, the test circuit bus line 6 is decoupled from the address bus line 2. When a high level is present on the test mode line 8, that is to say when a functional test is intended to be carried out, by contrast, the decoupling circuit 7 interconnects the address bus line 2 with the test circuit bus line 6. In both switching states, the latch circuit 72 ensures that the test circuit line 6 is held at a defined level in each case.

The switching operation specifically functions as follows: if the test mode line 8 is set to a high level, the first inverter 73 of the inverter circuit 71 generates a low level at its output. The low level is output to the first control input of the tristate inverter 74. The high level of the test mode line 8 is furthermore present at the second control input of the tristate inverter 74. This driving causes the tristate inverter 74 to be activated, so that the address bus signal at the input of the tristate inverter 74 is converted into an inverted signal at its output, that is to say a high level is converted into a low level, and vice versa.

The output signal of the tristate inverter 74 is in turn present at the input of the second inverter 75 of the latch circuit 72, which then again inverts the signal and outputs it onto the test circuit bus line 6. At the same time, the tristate inverter 76 of the latch circuit 72 is switched off since the high level of the test mode line 6 is present at the first control input and the low level of the output of the first inverter 73 is present at the second control input.

After the end of the functional test, the test mode line 8 is changed over to a low level, whereupon the first inverter 73 of the inverter circuit 71 converts the low level into a high level and applies it to the first control line of the tristate inverter 74. At the same time, the low level of the test mode line 8 is connected to the second control line of the inverting operational amplifier 74. In this state, the tristate inverter 74 effects blocking and decouples the address bus 2 from the latch circuit 72. The latch circuit 72 in turn simultaneously ensures that the signal from the test circuit bus 6 is kept constant. This is brought about by the activation of the second tristate inverter 76, on whose first control line the low level of the test mode line 8 is present and to whose second control line the high level of the first inverter 73 is connected, so that the output signal of the second inverter 75 in the latch circuit 72 is fed back to its input after having been inverted via the tristate inverter 76. This configuration of the decoupling circuit 7 is distinguished by a simple and reliable construction, the latch circuit 72 additionally ensuring that the test circuit bus 6 is always held at a defined level. Therefore, the test circuit bus 6 is also suitable as a shielding line, e.g. for control lines such as the clock line of the DRAM memory. For this purpose, the test line bus 6 is preferably routed parallel to such control lines, as a result of which the signal on these control lines is shielded.

The configuration of the memory module according to the invention with a test structure disposed in a distributed fashion makes it possible to reduce the area requirement for the test structure to a minimum, the individual test circuit blocks being connected to one another via a common test circuit bus, which is preferably part of the address bus. An interposed decoupling circuit ensures that the address bus is loaded with the test circuits only in the test state, as a result of which it is possible to avoid undesired power impairments in normal operation. At the same time, the connection of the test line bus to the address bus only during the test functionality ensures that the current consumption of the test structure can be reduced to a minimum amount.

The features of the invention which are disclosed in the above description, the claims and the drawings may be essential both individually and in any desired combination for the realization of the invention in its various embodiments.

We claim:

1. A memory module, comprising:
   an address bus including a first end and a second end;
   test lines;
   test circuit bus;
   a memory cell configuration;
   a test structure connected to said memory cell configuration through said test lines for testing said memory cell configuration, said test structure having at least a first test circuit and a second test circuit disposed in a distributed fashion and connected to one another via said test circuit bus and said address bus, said test circuit bus including at least a first circuit bus section and a second test circuit bus section, said first test circuit bus section coupling said firstend of said address bus to said first test circuit, and said second test circuit bus section coupling said second end of said address bus to said second test circuit.

2. The memory module according to claim 1, further comprising a first and a second decoupling circuit, said first decoupling circuit connected between said first test circuit bus section and said first end of said address bus, said second decoupling circuit connected between said second test circuit bus section and said second end of said address bus, said first decoupling circuit interconnecting said first test circuit bus section with said address bus and said second decoupling circuit interconnecting said second test circuit bus section with said address bus in an event of an activation of a test operation.

3. The memory module according to claim 2, wherein said first decoupling circuit has an inverter circuit connected to said address bus and a latch circuit connected to said first test circuit bus section, and said second decoupling circuit has an inverter circuit connected to said address bus and a latch circuit connected to said second test circuit bus section.

4. A memory module, comprising:
   test lines;
   an address bus including a first end and a second end;
   a test circuit bus having at least a first test circuit bus section and a second test circuit bus section;
   a memory cell configuration having memory cells and connected to said test lines;
   a test structure having at least a first test circuit and a second test circuit disposed in a distributed fashion and each of said first and second test circuits connected to said memory cell configuration through said test lines for performing a functional test of said memory cells, said first and second test circuits connected to one another through said test circuit bus for activating said first and second test circuits and for carrying out a test operation, said first test circuit bus section of said test circuit bus coupling said first test circuit to said first end of said address bus, said second test circuit bus section of said test circuit bus coupling said second test circuit to said second end of said address bus; and a decoupling switching configuration connected between said first test circuit bus section and said first end of said address bus and between said second test circuit bus section and said second end of said address bus, said decoupling switching configuration interconnecting said test circuit bus with said address bus in an event of an activation of the test operation.

5. The memory module according to claim 4,
   further comprising a common test mode line;
   wherein said decoupling switching configuration has at least a first decoupling circuit and a second decoupling circuit, said first decoupling circuit connected between said first test circuit bus section and said first end of said address bus, said second decoupling circuit connected between said second test circuit bus section and said second end of said address bus, said decoupling circuits connected to and being driven by said common test mode line for connecting said first test circuit bus section and said second test circuit bus section to said address bus if the functional test is intended to be carried out.

6. The memory module according to claim 5, wherein said decoupling switching configuration has an inverter circuit connected to said address bus, and a latch circuit connected to said first test circuit bus section and said second test circuit bus section.

* * * * *